(12) United States Patent
Xiao et al.

(10) Patent No.: US 9,299,566 B2
(45) Date of Patent: Mar. 29, 2016

(54) METHOD FOR FORMING GERMANIUM-BASED LAYER

(71) Applicant: Tsinghua University, Beijing (CN)

(72) Inventors: Lei Xiao, Beijing (CN); Jing Wang, Beijing (CN); Mei Zhao, Beijing (CN); Renrong Liang, Beijing (CN); Jun Xu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 48 days.

(21) Appl. No.: 14/350,715

(22) PCT Filed: Mar. 21, 2014

(86) PCT No.: PCT/CN2014/073847
§ 371 (c)(1),
(2) Date: Apr. 9, 2014

(87) PCT Pub. No.: WO2015/127702
PCT Pub. Date: Sep. 3, 2015

(65) Prior Publication Data
US 2015/0243506 A1   Aug. 27, 2015

(30) Foreign Application Priority Data

Feb. 25, 2014  (CN) .......................... 2014 1 0063248
Feb. 25, 2014  (CN) .......................... 2014 1 0063268
Feb. 25, 2014  (CN) .......................... 2014 1 0063532
Feb. 25, 2014  (CN) .......................... 2014 1 0064527
Feb. 25, 2014  (CN) .......................... 2014 1 0064546
Feb. 25, 2014  (CN) .......................... 2014 1 0064556

(51) Int. Cl.
*H01L 21/223* (2006.01)
*H01L 21/265* (2006.01)
*H01L 21/285* (2006.01)

(52) U.S. Cl.
CPC ........ *H01L 21/26513* (2013.01); *H01L 21/223* (2013.01); *H01L 21/2236* (2013.01); *H01L 21/28512* (2013.01)

(58) Field of Classification Search
CPC .............. H01L 21/2236; H01L 21/223; H01L 21/28512; H01L 21/02441; H01L 21/02532; H01L 21/02535
See application file for complete search history.

(56) References Cited

U.S. PATENT DOCUMENTS 4,332,627 A * 6/1982 Schmitt et al. ................. 438/527
4,603,471 A * 8/1986 Strain ............................ 438/199

(Continued)

OTHER PUBLICATIONS

Conrad, J.R. "Plasma source ion implantation: A new, cost-effective, non-line-of-sight technique for ion implantation of materials" Surf. and Coat. Tech. vol. 36, Iss. 3-4 Dec. 15, 1988, pp. 927-937.*

(Continued)

*Primary Examiner* — Matthew Landau
*Assistant Examiner* — Grant Withers
(74) *Attorney, Agent, or Firm* — Houtteman Law LLC

(57) ABSTRACT

A method for forming a germanium-based layer is provided. The method includes: providing a substrate having a Ge or GeSi surface layer; and implanting atoms, molecules, ions or plasmas containing an element Sn into the Ge surface layer to form a Ge-based GeSn layer, or implanting atoms, molecules, ions or plasmas containing an element Sn into the GeSi surface layer to form a Ge-based GeSnSi layer, or co-implanting atoms, molecules, ions or plasmas containing elements Sn and Si into the Ge surface layer to form a Ge-based GeSnSi layer.

17 Claims, 5 Drawing Sheets

(56) References Cited

U.S. PATENT DOCUMENTS

| | | | |
|---|---|---|---|
| 5,256,550 A * | 10/1993 | Laderman et al. | 438/509 |
| 7,915,104 B1 * | 3/2011 | Kouvetakis et al. | 438/172 |
| 2007/0020891 A1 * | 1/2007 | Kouvetakis et al. | 438/479 |
| 2007/0048906 A1 * | 3/2007 | Han | 438/142 |
| 2010/0151666 A1 * | 6/2010 | Kouvetakis et al. | 438/488 |
| 2012/0313168 A1 * | 12/2012 | Cheng et al. | 257/347 |
| 2014/0048765 A1 * | 2/2014 | Ma et al. | 257/12 |
| 2014/0053894 A1 * | 2/2014 | Roucka et al. | 136/255 |
| 2014/0054658 A1 * | 2/2014 | Ma et al. | 257/288 |
| 2014/0057418 A1 * | 2/2014 | Ma et al. | 438/479 |
| 2014/0077338 A1 * | 3/2014 | Roucka et al. | 257/613 |
| 2014/0197376 A1 * | 7/2014 | Ma et al. | 257/24 |
| 2014/0209976 A1 * | 7/2014 | Yang et al. | 257/190 |
| 2014/0225899 A1 * | 8/2014 | Bekmambetov et al. | 345/473 |
| 2014/0273323 A1 * | 9/2014 | Kim | 438/47 |
| 2014/0291642 A1 * | 10/2014 | Watabe et al. | 257/40 |
| 2014/0291727 A1 * | 10/2014 | Zhao et al. | 257/192 |
| 2015/0079803 A1 * | 3/2015 | Huang et al. | 438/758 |

OTHER PUBLICATIONS

Guibertoni D. "Solid Phase Epitaxial Re-Growth of Sn Ion Implanted Germanium Thin Films" AIP Conf. Proc. 1496 pp. 103-106 Jun. 29, 2012.*

Kringhoj P. "Diffusion of ion implanted Sn in Si, $Si_{1-x}Ge_x$, and Ge" App. Phys. Lett. 65, 324 Jun. 18, 1994 pp. 324-326.*

Weyer, G. "Covalency Effects on implanted 119Sn in Group IV Semiconductors studied by Mossbauer and channeling experiments" Hyperfine Interactions vol. 1, Iss. 1 Jun. 1975 pp. 93-112.*

Wolf, S. "Silicon Processing for the VLSI Era" vol. 1 2nd ed. copyright 2000 pp. 147-148.*

Gleixner webmaster for "San Jose State University Sputtering Notes for MatE 129" available online at https://web.archive.org/web/*/http://www.engr.sjsu.edu/sgleixner/mate129/Continuing%20Ed/Deposition/sputtering.pdf as of Oct. 10, 2008 pp. 1-4.*

* cited by examiner

METHOD FOR FORMING GERMANIUM-BASED LAYER

CROSS-REFERENCE TO RELATED APPLICATIONS

This application claims priority to and benefits of the following applications:
1) Chinese Patent Application Serial No. 201410063532.X, filed with the State Intellectual Property Office of P. R. China on Feb. 25, 2014;
2) Chinese Patent Application Serial No. 201410063268.X, filed with the State Intellectual Property Office of P. R. China on Feb. 25, 2014;
3) Chinese Patent Application Serial No. 201410064556.7, filed with the State Intellectual Property Office of P. R. China on Feb. 25, 2014;
4) Chinese Patent Application Serial No. 201410064546.3, filed with the State Intellectual Property Office of P. R. China on Feb. 25, 2014;
5) Chinese Patent Application Serial No. 201410063248.2, filed with the State Intellectual Property Office of P. R. China on Feb. 25, 2014; and 6) Chinese Patent Application Serial No. 201410064527.0, filed with the State Intellectual Property Office of P. R. China on Feb. 25, 2014;

The entire contents of the above applications are incorporated herein by reference.

FIELD

The present disclosure relates to a semiconductor design and fabrication field, and more particularly to a method for forming a germanium-based layer.

BACKGROUND

With an increasingly scaling down of a feature size of MOSFET (metal-oxide-semiconductor field-effect transistor), a low carrier mobility of Si has become a primary factor restraining a performance of devices. In order to solve the problem, a material with higher mobility is adopted as the channel material, for example, Ge is adopted as the channel material in PMOSFETs, and a group III-V compound semiconductor material is adopted as the channel material in NMOSFETs. A hole mobility of Ge is around four times as great as that of Si, and currently a lot of technical challenges for a Ge channel MOSFET have been overcome. A group IV semiconductor material Ge-based $Ge_{1-x}Sn_x$ (GeSn) compatible with Ge has a good electrical property. Firstly, since the strained GeSn has a greater hole mobility than Ge, the strained GeSn has a good application prospect on a channel of PMOSFET; secondly, a uniaxis compressive strain may be introduced in a Ge channel of a MOSFET device by filling a strained $Ge_{1-x}Sn_x$ ($0<x<1$) (GeSn) alloy in a source region and a drain region, thus greatly improving a performance of the Ge channel MOSFET, especially when a length of the Ge channel is on a nanometer scale; thirdly, according to a theoretic research, the strained $Ge_{1-x}Sn_x$ ($x>0.11$) alloy will be a direct bandgap semiconductor with a good opto-electrical property. Furthermore, the GeSn alloy is compatible with a conventional silicon CMOS (complementary metal oxide semiconductor) process.

However, it is difficult to directly grow a GeSn alloy with high crystalline quality and high Sn content on a Ge substrate. The reasons are illustrated as follows. Firstly, an equilibrium solid solubility of Sn in Ge is less than 1% (i.e., about 0.3%); secondly, a surface segregation of Sn easily occurs because the surface energy of Sn is smaller than that of Ge; and thirdly, there is a large lattice mismatch (about 14.7%) between Ge and α-Sn. In order to suppress the surface segregation of Sn and increase the content of Sn, a certain amount of Si may be doped during a growth to form a $Ge_{1-x-y}Sn_xSi_y$ ($0<x<1$, $0<y<1$) (GeSnSi) layer. Because a lattice constant of Si is smaller than that of Ge, but a lattice constant of Sn is larger than that of Ge, a thermal stability of the GeSnSi alloy may be improved by doping Si into it.

It is difficult to fabricate GeSn and GeSnSi since both materials are metastable Ge-based materials. Molecular beam epitaxy (MBE) is conventionally used for growing the GeSn alloy. By using such a method, a GeSn film with high crystal quality may be obtained. Disadvantages (such as expensive equipment, time-consuming fabrication process and high cost) of such a method, however, limit a large scale production. In addition, a uniformity of the film formed by MBE needs to be further improved. Alternatively, chemical vapor deposition (CVD) is also used for growing the GeSn or GeSnSi film but has disadvantages of poor film quality, poor thermal stability, easy segregation of Sn and high cost.

SUMMARY

Embodiments of the present disclosure seek to solve at least one of the problems existing in the related art to at least some extent.

According to an embodiment of the present disclosure, a method for forming a germanium-based layer is provided. The method comprises: providing a substrate having a Ge or GeSi surface layer; and implanting atoms, molecules, ions or plasmas containing an element Sn into the Ge surface layer to form a Ge-based GeSn layer, or implanting atoms, molecules, ions or plasmas containing an element Sn into the GeSi surface layer to form a Ge-based GeSnSi layer, or co-implanting atoms, molecules, ions or plasmas containing elements Sn and Si into the Ge surface layer to form a Ge-based GeSnSi layer.

With the method for forming the germanium-based layer, a Ge-based GeSn layer or a Ge-based GeSnSi layer with a better crystalline quality is obtained. The method is simple to implement and low in cost.

In one embodiment, the method further comprises: forming a mask on the substrate and forming an opening in the mask before the implanting, wherein the Ge or GeSi surface layer is exposed from the opening.

In one embodiment, the implanting or the co-implanting comprises an ion implantation.

In one embodiment, the ion implantation comprises a plasma source ion implantation and a plasma immersion ion implantation.

In one embodiment, the implanting or the co-implanting comprises a magnetron sputtering.

In one embodiment, during the magnetron sputtering, a negative bias voltage is applied to the substrate.

In one embodiment, a Sn coating film is formed on the Ge-based GeSn layer or the Ge-based GeSnSi layer during the magnetron sputtering, if the atoms, molecules, ions or plasmas containing only the element Sn are implanted; or a Si—Sn coating film is formed on the Ge-based GeSnSi layer during the magnetron sputtering, if the atoms, molecules, ions or plasmas containing the elements Sn and Si are co-implanted.

In one embodiment, the method further comprises: removing the Sn coating film or the Si—Sn coating film.

In one embodiment, the Sn coating film or the Si—Sn coating film is removed by means of a rinse solution with a high selective etching ratio between the Ge-based GeSn layer and the Sn coating film or between the Ge-based GeSnSi layer and the Sn coating film or between the Ge-based GeSnSi layer and the Si—Sn coating film.

In one embodiment, the method further comprises: heating the substrate at a heating temperature ranging from 100° C. to 600° C. during the implanting.

In one embodiment, the heating temperature ranges from 150° C. to 450° C.

In one embodiment, the method further comprises: annealing the Ge-based GeSn layer or the Ge-based GeSnSi layer at an annealing temperature ranging from 100° C. to 600° C. after the implanting.

In one embodiment, the annealing temperature ranges from 150° C. to 450° C.

In one embodiment, the Ge-based GeSn layer or the Ge-based GeSnSi layer is strained.

In one embodiment, a thickness of the Ge-based GeSn layer or the Ge-based GeSnSi layer ranges from 0.5 nm to 100 nm.

In one embodiment, a Sn content of the Ge-based GeSn layer or the Ge-based GeSnSi layer is less than 20% by atom percent.

In one embodiment, the substrate having the Ge surface layer comprises any one of a Ge substrate, a Ge-on-insulator substrate and a Si substrate with a Ge surface.

In one embodiment, the substrate having the GeSi surface layer comprises any one of a GeSi-on-insulator substrate, a Si substrate with a GeSi surface and a Ge substrate with a GeSi surface.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
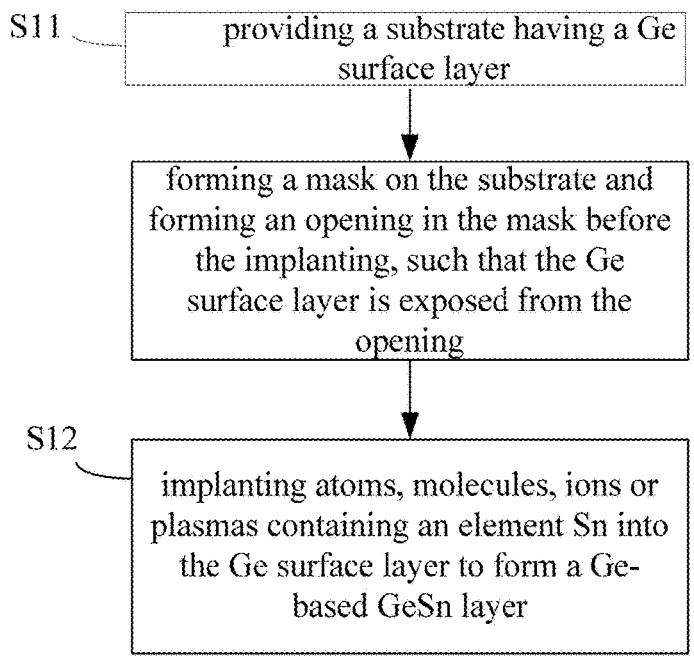
FIG. 1 is a flow chart of a method for forming a GeSn layer according to a first embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, unless specified or limited otherwise, relative terms such as "central", "longitudinal", "lateral", "front", "rear", "right", "left", "inner", "outer", "lower", "upper", "horizontal", "vertical", "above", "below", "up", "top", "bottom" as well as derivative thereof (e.g., "horizontally", "downwardly", "upwardly", etc.) should be construed to refer to the orientation as then described or as shown in the drawings under discussion. These relative terms are for convenience of description and do not require that the present disclosure be constructed or operated in a particular orientation.

In terms of conventional methods for forming a GeSn layer or a GeSnSi layer, a MBE method has disadvantages of expensive equipment, ultra-high vacuum, time-consuming fabrication process and high cost, and a CVD method has disadvantages of poor film quality, poor thermal stability, high cost and easy segregation of Sn at a high growth temperature. In addition, it is difficult to form a high quality film in a selective region by both the MBE method and the CVD method, that is, neither the MBE method nor the CVD method is proper for selectively growing the high quality film.

A method for forming a Ge-based layer (i.e., a GeSn layer or a GeSnSi layer) is provided according to embodiments of the present disclosure. A surface modification is performed for an original Ge or GeSi layer by using an implantation process, that is, the atoms, molecules, ions or plasmas containing an element Sn are implanted into the original Ge or GeSi layer to form a GeSn layer or a GeSnSi layer, or the atoms, molecules, ions or plasmas containing elements Sn and Si are co-implanted into the original Ge layer to form a GeSnSi layer. By adjusting a temperature and an implanting dose, the implanted element Sn may not be diffused obviously, such that the Sn atoms in lattice may not be aggregated to form a Sn precipitate, thus keeping a GeSn or GeSnSi alloy in its metastable state without precipitation and surface segregation. In this way, a GeSn or GeSnSi layer with a better crystalline quality is obtained. The method is simple to implement and low in cost.

Three embodiments will be illustrated below in detail with reference to drawings.

FIG. 1 is a flow chart of a method for forming a GeSn layer according to a first embodiment of the present disclosure. As shown in FIG. 1, the method may comprise following steps.

At step S11, a substrate having a Ge surface layer is provided.

Specifically, the substrate may be a Ge substrate, a Ge-on-insulator substrate, or a Si substrate with a Ge surface.

At step S12, atoms, molecules, ions or plasmas containing an element Sn are implanted into the Ge surface layer to form a GeSn layer.

Specifically, if a thick GeSn layer is required, only the ions or plasmas which have higher energy may be implanted into the Ge surface layer to arrive at an intended depth; if a thin GeSn layer is required, the atoms, molecules, ions or plasmas may be implanted into the Ge surface layer. In one embodiment, only a part of the Ge surface layer is converted into the GeSn layer. In another embodiment, the whole Ge surface layer is converted into the GeSn layer.

Alternatively, a mask is formed on the substrate, and an opening is formed in the mask before the implanting (i.e., step S12). The Ge surface layer is exposed from the opening. In this way, the GeSn layer may be formed in a selective region rather than in a global region.

In an exemplary example, the implantation may be implemented by an ion implantation, that is, an ion beam (including ions or plasmas) with certain energy and containing the element Sn is injected into the Ge surface layer, such that a part of the Ge surface layer or the whole Ge surface layer is converted into a GeSn alloy (i.e., the GeSn layer). An implanting depth depends on the energy of the ion beam, that is, the higher the energy of the ion beam is, the larger the implanting depth is, and thus the thicker the GeSn layer is. In one embodiment, a thickness of the GeSn layer may range from 0.5 nm to 100 nm. During the implanting, a varying voltage may be used to vary the energy of the ion beam, such that the element Sn may be distributed uniformly within a certain range. Specifically, the ion implantation may comprise a plasma source ion implantation and a plasma immersion ion implantation, i.e., a plasma-based ion implantation (PBII). For the PBII, the Ge surface layer is immersed in the plasmas containing the element Sn, positive plasmas containing the element Sn are accelerated by an electric field, injected to the surface of the Ge surface layer and finally implanted into the Ge surface layer. It is easy to achieve a high implanting dose by the PBII, for example, a Sn content of the GeSn layer may range from 1% to 20% by atom percent. In this way, a production efficiency is improved and the cost is lowered. Since the PBII is less affected by a morphology of a substrate surface, it is particularly preferred for nonplanar structures to ensure a uniform implantation.

In another exemplary example, the implantation may be implemented by a magnetron sputtering. During the magnetron sputtering, Ar ions are accelerated by an electric field to reach a Sn or Sn-contained target, and bombard the target with high energy to make the target generate a sputtering. Sputtered particles contain a major portion of atoms and a minor portion of ions. By adjusting a process parameter (such as a voltage of the electric field, or a vacuum degree), the sputtered particles may have higher energy and are injected to the Ge surface layer at a higher speed. A portion of the sputtered particles may be implanted into the Ge surface layer to form the metastable GeSn alloy. Alternatively, during the magnetron sputtering, a negative bias voltage (for example, ranging from −40 to −120V) is applied to the substrate, which may provide the portion of the sputtered particles with higher energy so as to implant these sputtered particles into a larger depth (such as a few nanometers) of the Ge surface layer. It should be noted that, because a great number of particles are sputtered, a Sn coating film may be further formed on the GeSn layer. Therefore, the method further comprises removing the Sn coating film, for example, by means of a rinse solution with a high selective etching ratio between GeSn and Sn. Such a rinse solution comprises: diluted hydrochloric acid, diluted sulphuric acid and diluted nitric acid. After rinsing, the thickness of the GeSn layer may range from 0.5 nm to 20 nm, preferably from 0.5 nm to 10 nm.

In one example, an ion beam sputtering is also used to implant Sn atoms into the GeSn layer. Compared with the magnetron sputtering, during the ion beam sputtering, an ion beam is introduced via an ion optical system so as to avoid an influence of a plasma ambiance on the sputtering process. By adjusting the energy of the ion beam, most sputtered particles may contain only a single Sn atom and Sn atoms in the GeSn layer are not liable to aggregation, thus improving the quality and the thermal stability of the GeSn layer.

In this embodiment, the substrate may be heated during the implanting. A heating temperature may range from 100° C. to 600° C., preferably from 150° C. to 450° C. The film formed at this heating temperature will have a better crystalline quality. A lattice damage resulting from the implantation may not be repaired at an over low heating temperature (e.g., lower than 100° C.), such that the quality of the GeSn layer may be poor and GeSn in the GeSn layer is liable to form an amorphous state. Sn atoms in the GeSn layer may be seriously diffused at an over high heating temperature (e.g., higher than 600° C.), such that Sn atoms may be segregated from the GeSn layer since an equilibrium solid solubility of Sn in Ge is very low, e.g., is only 0.3% by atom percent in an equilibrium state.

In this embodiment, the GeSn layer may be annealed after the implanting so as to further improve the crystal quality of the GeSn layer. An annealing temperature may range from 100° C. to 600° C., preferably from 150° C. to 450° C. The lattice damage resulting from the implantation may not be repaired at an over low annealing temperature (e.g., lower than 100° C.), such that the quality of the GeSn layer may be poor. Sn atoms in the GeSn layer may be seriously diffused at an over high annealing temperature (e.g., higher than 600° C.), such that the Sn atoms may be segregated from the GeSn layer since the equilibrium solid solubility of Sn in Ge is very low.

In this embodiment, the GeSn layer is strained. A thickness of the strained GeSn layer may range from 0.5 nm to 100 nm. In this embodiment, a Sn content of the strained GeSn layer is less than 20% by atom percent. It should be noted that, the higher the Sn content of the fully strained GeSn layer is, the larger the strain degree of the fully strained GeSn layer is, and correspondingly the thickness of the strained GeSn layer should be less than its critical thickness to keep it fully strained, that is, the higher the Sn content of the strained GeSn layer is, the smaller the critical thickness of the strained GeSn layer is. Here, the critical thickness is determined by a condition that strain energy of the strained GeSn layer is equal to a minimum dislocation formation energy. For example, when the Sn content of the strained GeSn layer on a Ge substrate is 20%, the strain degree of the fully strained GeSn layer is about 3%, and the critical thickness of the strained GeSn layer is about 5 nm. Also for example, when the Sn content of the strained GeSn layer on the Ge substrate is 5%, the strain degree thereof is about 0.8%, and the critical thickness thereof may be above 100 nm or even above 130 nm.

It should be noted that, when the GeSn layer is strained, the heating temperature and the annealing temperature need to match with material properties of the strained GeSn layer. For example, because the Sn content of the strained GeSn layer in a common MOSFET device usually ranges from 3% to 8% by atom percent, and the strained GeSn layer with a Sn content of 8% is stable at a temperature below 450° C., the heating temperature and the annealing temperature should not exceed 450° C.

A specific embodiment will be illustrated below with reference to FIGS. 2-6 for a better understanding of the present disclosure.

Firstly, an n-type Ge substrate is provided and rinsed sequentially by acetone, absolute ethyl alcohol, deionized water and hydrofluoric acid.

Secondly, atoms and ions containing an element Sn are implanted into a surface layer of the Ge substrate by the magnetron sputtering. During the magnetron sputtering, a vacuum degree is less than $10^{-4}$ Pa, and the Ge substrate is heated at a temperature ranging from 100° C. to 200° C. Firstly, a strained GeSn layer is formed on the Ge surface layer, and then a Sn coating layer is formed on the strained GeSn layer. The strained GeSn layer may be annealed at a temperature ranging from 100° C. to 200° C. after the implanting so as to further improve the crystalline quality of the strained GeSn layer.

Finally, the Sn coating layer is removed to expose the strained GeSn layer by means of a diluted hydrochloric acid (such as with a concentration of 5%).

Figure 2:
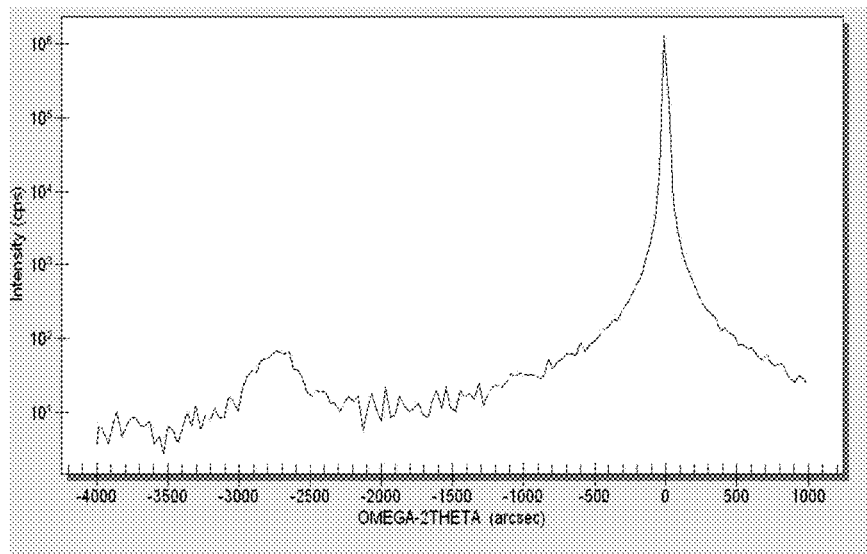
FIG. 2 is an X-ray diffraction (XRD) rocking curve from a (004) plane of a GeSn/Ge structure according to an embodiment of the present disclosure.
Figure 3:
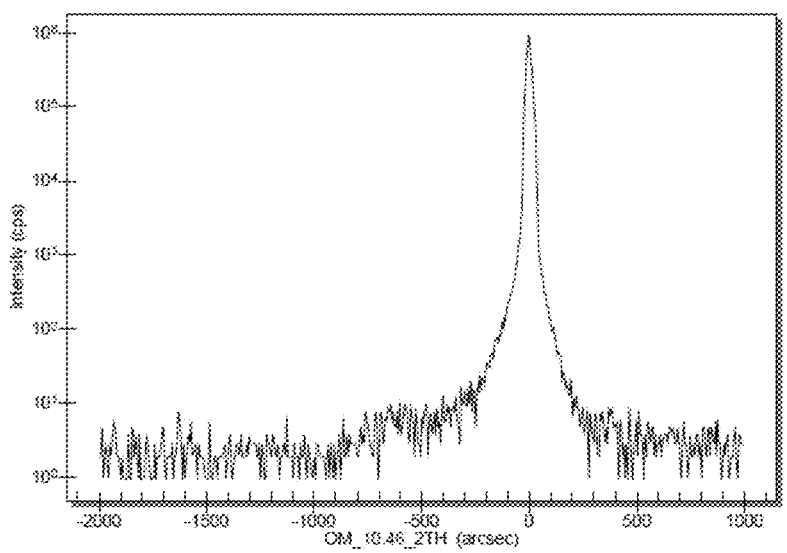
FIG. 3 is an XRD rocking curve from a (224) plane of the GeSn/Ge structure according to an embodiment of the present disclosure.
Figure 4:
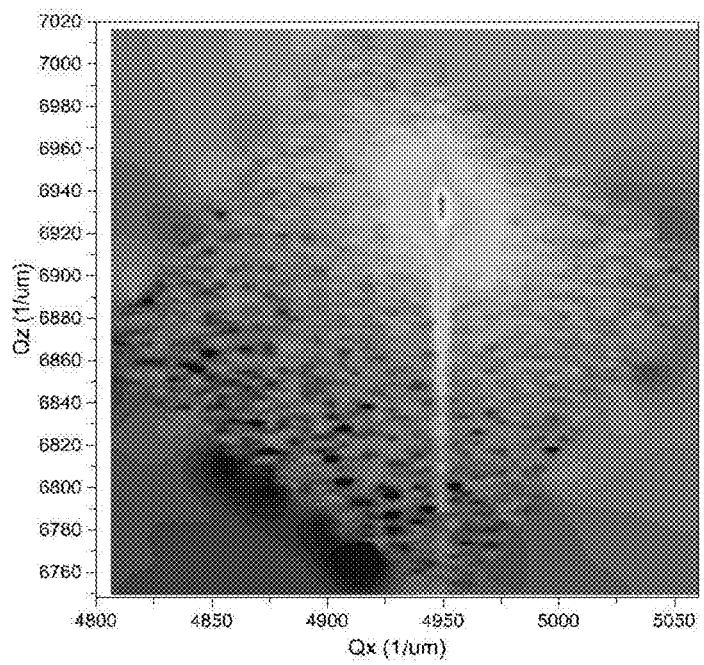
FIG. 4 is an XRD (224) reciprocal space map of the GeSn/Ge structure according to an embodiment of the present disclosure.

A structure, a crystalline state, a strain state and the Sn content of the GeSn layer are characterized by using a high resolution XRD. An omega-theta scanning is performed for a (004) plane of a GeSn/Ge structure, and a result is shown in FIG. 2, in which a diffraction peak at 0 arcsec is corresponding to a (004) plane of the Ge substrate, while a diffraction peak at around −2600 arcsec is corresponding to the (004) plane of the GeSn layer. Also an omega-Xtheta (X=10.46) scanning is performed for a (224) plane of the GeSn/Ge structure, and a result is shown in FIG. 3, in which a diffraction peak at 0 arcsec is corresponding to a (224) plane of the Ge substrate, while a diffraction peak at around −600 arcsec is corresponding to a (224) plane of the GeSn layer. It can be concluded from the results that the GeSn layer formed by above method is strained and the Sn content of the strained GeSn layer is about 8% by atom percent. It can be observed from an XRD (224) reciprocal space map of the GeSn layer, vertically downward extended reciprocal space points in the map are attributed to the strained GeSn layer, as shown in FIG. 4. The result further indicates that the GeSn layer formed by this method is strained.

Figure 5:
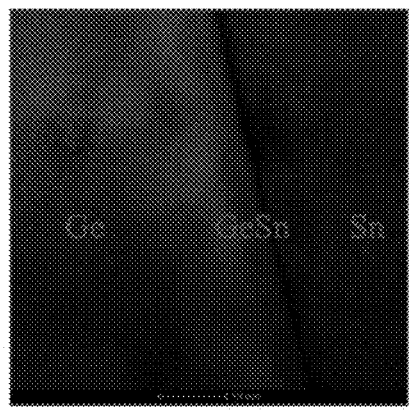
FIG. 5 is a cross-sectional Transmission Electron Microscopy (TEM) image of the GeSn/Ge structure according to an embodiment of the present disclosure.
Figure 6:
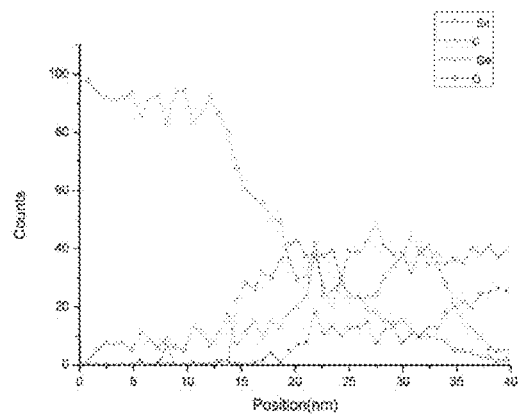
FIG. 6 is an energy dispersive spectroscopy (EDS) line-scan profile of Ge, Sn, O and C of the GeSn/Ge structure during the cross-sectional TEM observation.

A cross-sectional morphology and an interface of the GeSn/Ge structure are characterized by using a high resolution TEM and a result is shown in FIG. 5. It can be observed from FIG. 5 that the interface of the GeSn/Ge structure is smooth and a film quality is good. An element distribution in the GeSn layer is characterized by using EDS line scan in TEM and a result is shown in FIG. 6. It can be seen from FIG. 6 that a thickness of the GeSn layer is about 5 nm.

Figure 7:
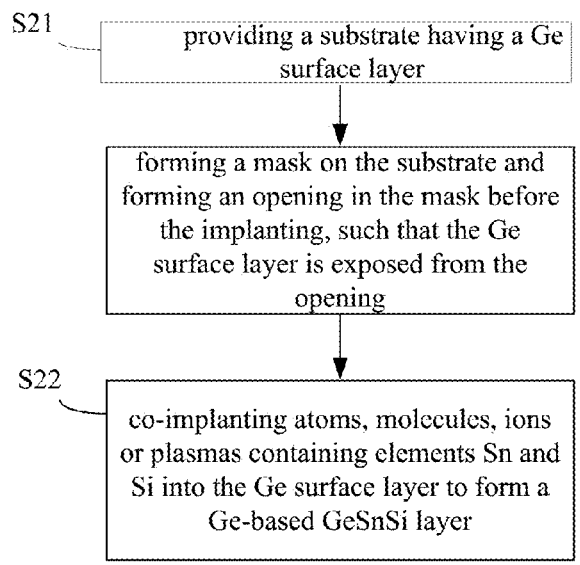
FIG. 7 is a flow chart of a method for forming a GeSnSi layer according to a second embodiment of the present disclosure.

FIG. 7 is a flow chart of a method for forming a GeSnSi layer according to a second embodiment of the present disclosure. As shown in FIG. 7, the method may comprise following steps.

At step S21, a substrate having a Ge surface layer is provided.

Specifically, the substrate may be a Ge substrate, a Ge-on-insulator substrate, or a Si substrate with a Ge surface.

At step S22, atoms, molecules, ions or plasmas containing elements Sn and Si are co-implanted into the Ge surface layer to form a GeSnSi layer.

Specifically, if a thick GeSnSi layer is required, only the ions or plasmas which have higher energy may be implanted into the Ge surface layer to arrive at an intended depth; if a thin GeSnSi layer is required, the atoms, molecules, ions or plasmas may be implanted into the Ge surface layer. In one embodiment, only a part of the Ge surface layer is converted into the GeSnSi layer. In another embodiment, the whole Ge surface layer is converted into the GeSnSi layer.

Alternatively, a mask is formed on the substrate, and an opening is formed in the mask before the implanting (i.e., step S22). The Ge surface layer is exposed from the opening. In this way, the GeSnSi layer may be formed in a selective region rather than in a global region.

In an exemplary example, the implantation may be implemented by an ion implantation, that is, an ion beam (including ions or plasmas) with certain energy and containing the elements Sn and Si is injected into the Ge surface layer, such that a part of the Ge surface layer or the whole Ge surface layer is converted into a GeSnSi alloy (i.e., the GeSnSi layer). An implanting depth depends on the energy of the ion beam, that is, the higher the energy of the ion beam is, the larger the implanting depth is, and thus the thicker the GeSnSi layer is. In one embodiment, a thickness of the GeSnSi layer may range from 0.5 nm to 100 nm. During the implanting, a varying voltage may be used to vary the energy of the ion beam, such that the elements Sn and Si may be distributed uniformly within a certain range. Specifically, the ion implantation may comprise a plasma source ion implantation and a plasma immersion ion implantation, i.e., a plasma-based ion implantation (PBII). For the PBII, the Ge surface layer is immersed in the plasmas containing the elements Sn and Si, positive plasmas containing the elements Sn and Si are accelerated by an electric field, injected to the surface of the Ge surface layer and finally implanted into the Ge surface layer. It is easy to achieve a high implanting dose by the PBII, for example, a Sn content of the GeSnSi layer may range from 1% to 20% by atom percent. In this way, a production efficiency is improved and the cost is lowered. Since the PBII is less affected by a morphology of a substrate surface, it is particularly preferred for nonplanar structures to ensure a uniform implantation.

In another exemplary example, the implantation may be implemented by a magnetron sputtering. During the magnetron sputtering, Ar ions are accelerated by an electric field to reach a Si—Sn (i.e., a mixture of Si and Sn) target, and bombard the target with high energy to make the target generate a sputtering. Sputtered particles contain a major portion of atoms and a minor portion of ions. By adjusting a process parameter (such as a voltage of the electric field, or a vacuum degree), the sputtered particles may have higher energy and are injected to the Ge surface layer at a higher speed. A portion of the sputtered particles may be implanted into the Ge surface layer to form the metastable GeSnSi alloy. Alternatively, during the magnetron sputtering, a negative bias voltage (for example, ranging from −40 to −120V) is applied to the substrate, which may provide the portion of the sputtered particles with higher energy so as to implant these sputtered particles into a larger depth (such as a few nanometers) of the Ge surface layer. It should be noted that, because a great number of particles are sputtered, a Si—Sn coating film may be further formed on the GeSnSi layer. Therefore, the method further comprises removing the Si—Sn coating film, for example, by means of a rinse solution with a high selective etching ratio between GeSnSi and Si—Sn. Such a rinse solution comprises: diluted hydrochloric acid, diluted sulphuric acid and diluted nitric acid. After rinsing, the thickness of the GeSnSi layer may range from 0.5 nm to 20 nm, preferably from 0.5 nm to 10 nm.

In one example, an ion beam sputtering is also used to implant Sn and Si atoms into the GeSnSi layer. Compared with the magnetron sputtering, during the ion beam sputtering, an ion beam is introduced via an ion optical system so as to avoid an influence of a plasma ambiance on the sputtering process. By adjusting the energy of the ion beam, most sputtered particles may contain only a single Sn atom and Sn atoms in the GeSnSi layer are not liable to aggregation, thus improving the quality and the thermal stability of the GeSnSi layer.

In this embodiment, the substrate may be heated during the implanting. A heating temperature may range from 100° C. to 600° C., preferably from 150° C. to 450° C. The film formed at this heating temperature will have a better crystalline quality. A lattice damage resulting from the implantation may not be repaired at an over low heating temperature (e.g., lower than 100° C.), such that the quality of the GeSnSi layer may be poor and GeSnSi in the GeSnSi layer is liable to form an amorphous state. Sn atoms in the GeSnSi layer may be seriously diffused at an over high heating temperature (e.g., higher than 600° C.), such that Sn atoms may be segregated from the GeSnSi layer since an equilibrium solid solubility of Sn in Ge is very low, e.g., is only 0.3% by atom percent in an equilibrium state.

In this embodiment, the GeSnSi layer may be annealed after the implanting so as to further improve the crystal quality of the GeSnSi layer. An annealing temperature may range from 100° C. to 600° C., preferably from 150° C. to 450° C. The lattice damage resulting from the implantation may not be repaired at an over low annealing temperature (e.g., lower than 100° C.), such that the quality of the GeSnSi layer may be poor. Sn atoms in the GeSnSi layer may be seriously diffused at an over high annealing temperature (e.g., higher than 600° C.), such that the Sn atoms may be segregated from the GeSnSi layer since the equilibrium solid solubility of Sn in Ge is very low.

In this embodiment, the GeSnSi layer is strained. A thickness of the strained GeSnSi layer may range from 0.5 nm to 100 nm. In this embodiment, a Sn content of the strained GeSnSi layer is less than 20% by atom percent. It should be noted that, the higher the Sn content of the fully strained GeSnSi layer is, the larger the strain degree of the fully strained GeSnSi layer is, and correspondingly the thickness of the strained GeSnSi layer should be less than its critical thickness to keep it fully strained, that is, the higher the Sn content of the strained GeSnSi layer is, the smaller the critical thickness of the strained GeSnSi layer is. For example, when the Si content of the strained GeSnSi layer on a Ge substrate is 20% and the Sn content of the strained GeSnSi layer is 20%, the strain degree of the fully strained GeSnSi layer is about 2.3%, and the critical thickness of the strained GeSnSi layer is about 7 nm. Also for example, when the Si content of the strained GeSnSi layer is 20% and the Sn content of the strained GeSnSi layer is 10%, the strain degree thereof is about 0.8%, and the critical thickness thereof may be above 100 nm or even above 130 nm.

It should be noted that, when the GeSnSi layer is strained, the heating temperature and the annealing temperature need to match with material properties of the strained GeSnSi layer. For example, because the Sn content of the strained GeSnSi layer in a common MOSFET device usually ranges from 10% to 15% by atom percent, and by adding the element Si, the strained GeSnSi layer with a Sn content of 10%-15% is basically stable at a temperature below 450° C., the heating temperature and the annealing temperature should not exceed 450° C.

A specific embodiment will be illustrated below with reference to FIGS. 8-11 for a better understanding of the present disclosure.

Firstly, an n-type Ge substrate is provided and rinsed sequentially by acetone, absolute ethyl alcohol, deionized water and hydrofluoric acid.

Secondly, a Si slice is bonded on a surface of a Sn target with a certain area ratio to fabricate a Si—Sn combination target. Alternatively, a Si—Sn alloy target is prepared.

Thirdly, atoms and ions containing elements Sn and Si are co-implanted into the Ge surface layer by the magnetron sputtering. During the magnetron sputtering, a vacuum degree is less than $10^{-4}$ Pa, and the Ge substrate is heated at a temperature ranging from 100° C. to 200° C. Firstly, a strained GeSnSi layer is formed on a surface layer of the Ge substrate, and then a Si—Sn coating layer is formed on the strained GeSnSi layer. The strained GeSnSi layer may be annealed at a temperature ranging from 100° C. to 200° C. after the implanting so as to further improve the crystalline quality of the strained GeSnSi layer.

Finally, the Si—Sn coating layer is removed to expose the strained GeSnSi layer by means of a diluted hydrochloric acid (such as with a concentration of 10%).

Figure 8:
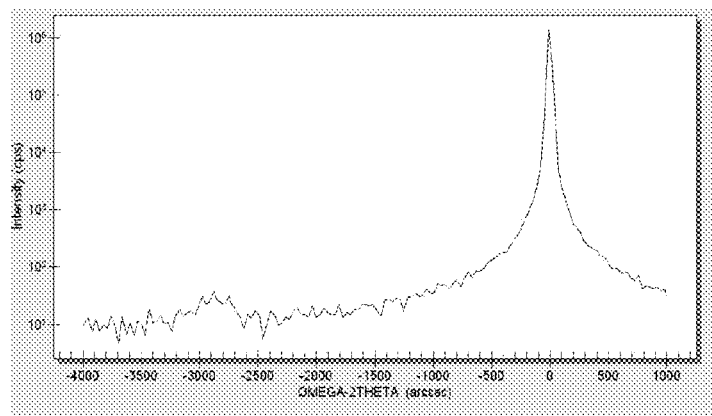
FIG. 8 is an XRD rocking curve from a (004) plane of a GeSnSi/Ge structure according to an embodiment of the present disclosure.
Figure 9:
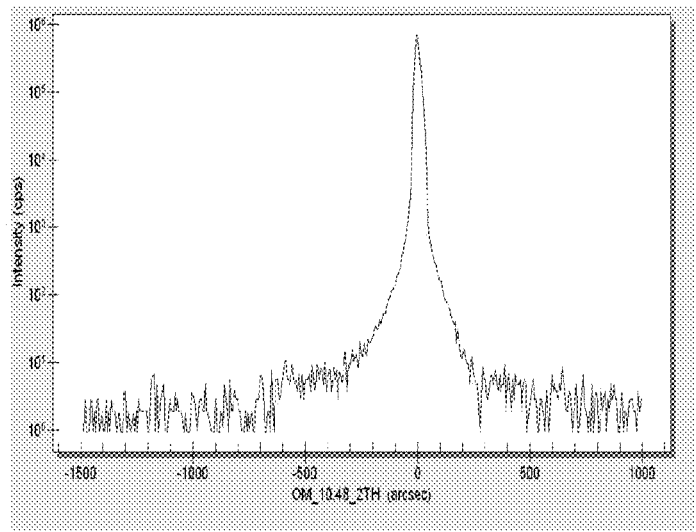
FIG. 9 is an XRD rocking curve from a (224) plane of the GeSnSi/Ge structure according to an embodiment of the present disclosure.

A structure, a crystalline state, a strain state and the Sn content of the GeSnSi layer are characterized by using a high resolution XRD. An omega-theta scanning is performed for a (004) plane of a GeSnSi/Ge structure, and a result is shown in FIG. 8, in which a diffraction peak at 0 arcsec is corresponding to the (004) plane of the Ge substrate, while a diffraction peak at around −2750 arcsec is corresponding to the (004) plane of the GeSnSi layer. Also an omega-Xtheta (X=10.48) scanning is performed for a (224) plane of the GeSnSi/Ge structure, and a result is shown in FIG. 9, in which a diffraction peak at 0 arcsec is corresponding to the (224) plane of the Ge substrate, while a diffraction peak at around −650 arcsec is corresponding to the (224) plane of the GeSnSi layer. It can be concluded from the results that the GeSnSi layer formed by above method is fully strained.

Figure 10:
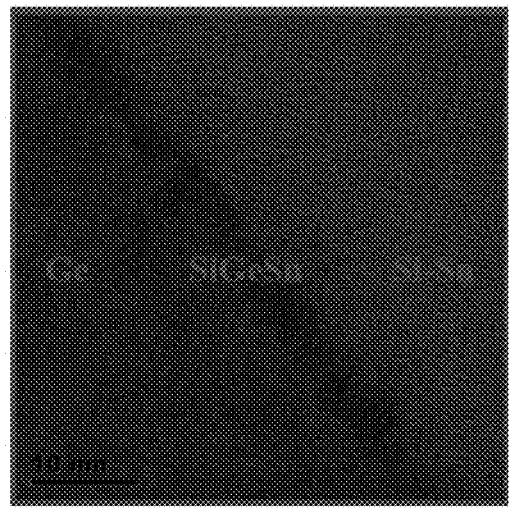
FIG. 10 is a cross-sectional TEM image of the GeSnSi/Ge structure according to an embodiment of the present disclosure.
Figure 11:
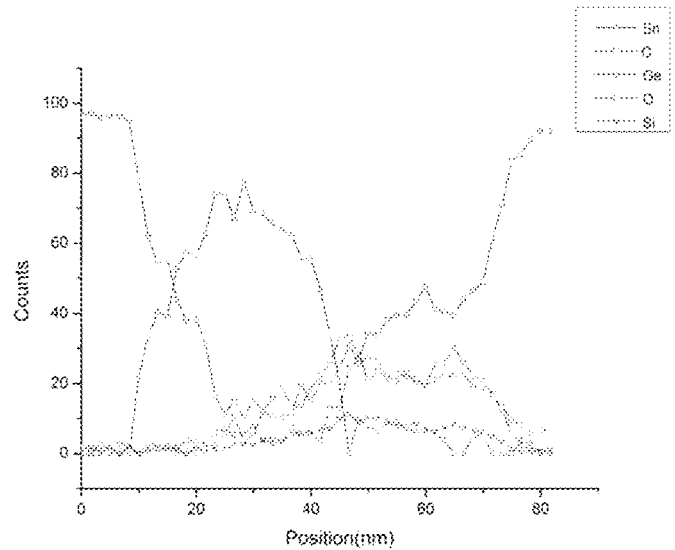
FIG. 11 is an EDS line-scan profile of Ge, Sn, Si, O and C of the GeSnSi/Ge structure during the cross-sectional TEM observation.

A cross-sectional morphology and an interface of the GeSnSi/Ge structure are characterized by using a high resolution TEM and a result is shown in FIG. 10. It can be observed from FIG. 10 that the interface of the GeSnSi/Ge structure is smooth and a film quality is good. An element distribution in the GeSnSi layer is characterized by using EDS line scan in TEM and a result is shown in FIG. 11. It can be seen from FIG. 11 that a thickness of the GeSnSi layer is about 10 nm.

Figure 12:
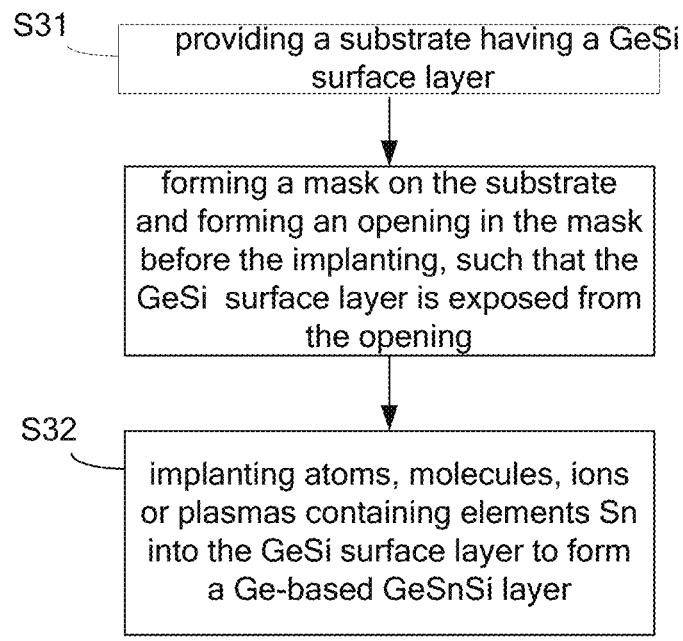
FIG. 12 is a flow chart of a method for forming a GeSnSi layer according to a third embodiment of the present disclosure.

FIG. 12 is a flow chart of a method for forming a GeSnSi layer according to a third embodiment of the present disclosure. As shown in FIG. 12, the method may comprise following steps.

At step S31, a substrate having a GeSi surface layer is provided.

Specifically, the substrate may be a GeSi-on-insulator substrate, a Si substrate with a GeSi surface or a Ge substrate with a GeSi surface.

At step S32, atoms, molecules, ions or plasmas containing an element Sn are implanted into the GeSi surface layer to form a GeSnSi layer.

Specifically, if a thick GeSnSi layer is required, only the ions or plasmas which have higher energy may be implanted into the GeSi surface layer to arrive at an intended depth; if a thin GeSnSi layer is required, the atoms, molecules, ions or plasmas may be implanted into the GeSi surface layer. In one embodiment, only a part of the GeSi surface layer is converted into the GeSnSi layer. In another embodiment, the whole GeSi surface layer is converted into the GeSnSi layer.

Alternatively, a mask is formed on the substrate, and an opening is formed in the mask before the implanting (i.e., step S32). The GeSi surface layer is exposed from the opening. In this way, the GeSnSi layer may be formed in a selective region rather than in a global region.

In an exemplary example, the implantation may be implemented by an ion implantation, that is, an ion beam (including ions or plasmas) with certain energy and containing the element Sn is injected into the GeSi surface layer, such that a part of the GeSi surface layer or the whole GeSi surface layer is converted into a GeSnSi alloy (i.e., the GeSnSi layer). An implanting depth depends on the energy of the ion beam, that is, the higher the energy of the ion beam is, the larger the implanting depth is, and thus the thicker the GeSnSi layer is. In one embodiment, a thickness of the GeSnSi layer may range from 0.5 nm to 100 nm. During the implanting, a varying voltage may be used to vary the energy of the ion beam, such that the element Sn may be distributed uniformly within a certain range. Specifically, the ion implantation may comprise a plasma source ion implantation and a plasma immersion ion implantation, i.e., a plasma-based ion implantation (PBII). For the PBII, the GeSi surface layer is immersed in the plasmas containing the element Sn, positive plasmas containing the element Sn are accelerated by an electric field, injected to the surface of the GeSi surface layer and finally implanted into the GeSi surface layer. It is easy to achieve a high implanting dose by the PBII, for example, a Sn content of the GeSnSi layer may range from 1% to 20% by atom percent. In this way, a production efficiency is improved and the cost is lowered. Since the PBII is less affected by a morphology of a substrate surface, it is particularly preferred for nonplanar structures to ensure a uniform implantation.

In another exemplary example, the implantation may be implemented by a magnetron sputtering. During the magnetron sputtering, Ar ions are accelerated by an electric field to reach a Sn or Sn-contained target, and bombard the target with high energy to make the target generate a sputtering. Sputtered particles contain a major portion of atoms and a minor portion of ions. By adjusting a process parameter (such as a voltage of the electric field, or a vacuum degree), the sputtered particles may have higher energy and are injected to the GeSi surface layer at a higher speed. A portion of the sputtered particles may be implanted into the GeSi surface layer to form the metastable GeSnSi alloy. Alternatively, during the magnetron sputtering, a negative bias voltage (for example, ranging from −40 to −120V) is applied to the substrate, which may provide the portion of the sputtered particles with higher energy so as to implant these sputtered particles into a larger depth (such as a few nanometers) of the GeSi surface layer. It should be noted that, because a great number of particles are sputtered, a Sn coating film may be further formed on the GeSnSi layer. Therefore, the method further comprises removing the Sn coating film, for example, by means of a rinse solution with a high selective etching ratio between GeSnSi and Sn. Such a rinse solution comprises: diluted hydrochloric acid, diluted sulphuric acid and diluted nitric acid. After rinsing, the thickness of the GeSnSi layer may range from 0.5 nm to 20 nm, preferably from 0.5 nm to 10 nm.

In one example, an ion beam sputtering is also used to implant Sn atoms into the GeSnSi layer. Compared with the magnetron sputtering, during the ion beam sputtering, an ion beam is introduced via an ion optical system so as to avoid an influence of a plasma ambiance on the sputtering process. By adjusting the energy of the ion beam, most sputtered particles may contain only a single Sn atom and Sn atoms in the GeSnSi layer are not liable to aggregation, thus improving the quality and the thermal stability of the GeSnSi layer.

In this embodiment, the substrate may be heated during the implanting. A heating temperature may range from 100° C. to 600° C., preferably from 150° C. to 450° C. The film formed at this heating temperature will have a better crystalline quality. A lattice damage resulting from the implantation may not be repaired at an over low heating temperature (e.g., lower than 100° C.), such that the quality of the GeSnSi layer may be poor and GeSnSi in the GeSnSi layer is liable to form an amorphous state. Sn atoms in the GeSnSi layer may be seriously diffused at an over high heating temperature (e.g., higher than 600° C.), such that Sn atoms may be segregated from the GeSnSi layer since an equilibrium solid solubility of Sn in Ge is very low, e.g., is only 0.3% by atom percent in an equilibrium state.

In this embodiment, the GeSnSi layer may be annealed after the implanting so as to further improve the crystal quality of the GeSnSi layer. An annealing temperature may range from 100° C. to 600° C., preferably from 150° C. to 450° C. The lattice damage resulting from the implantation may not be repaired at an over low annealing temperature (e.g., lower than 100° C.), such that the quality of the GeSnSi layer may be poor. Sn atoms in the GeSnSi layer may be seriously diffused at an over high annealing temperature (e.g., higher than 600° C.), such that the Sn atoms may be segregated from the GeSnSi layer since the equilibrium solid solubility of Sn in Ge is very low.

In this embodiment, the GeSnSi layer is strained. A thickness of the strained GeSnSi layer may range from 0.5 nm to 100 nm. In this embodiment, a Sn content of the strained GeSnSi layer is less than 20% by atom percent. It should be noted that, the higher the Sn content of the fully strained GeSnSi layer is, the larger the strain degree of the fully strained GeSnSi layer is, and correspondingly the thickness of the strained GeSnSi layer should be less than its critical thickness to keep it fully strained, that is, the higher the Sn content of the strained GeSnSi layer is, the smaller the critical thickness of the strained GeSnSi layer is. The strain degree of the GeSnSi layer on the GeSi layer is related to the Ge content and the strain degree of the GeSi layer. For example, when the Sn content of the strained GeSnSi layer on a Ge substrate is less than 20%, the strain degree of the fully strained GeSnSi layer ranges from 0 to 3%. Also for example, when the strain degree of the GeSnSi layer is about 2%, the critical thickness thereof may be about 8 nm. When the strain degree of the GeSnSi layer is about 0.8%, the critical thickness thereof may be above 100 nm or even above 130 nm.

It should be noted that, when the GeSnSi layer is strained, the heating temperature and the annealing temperature need to match with material properties of the strained GeSnSi layer. For example, because the Sn content of the strained GeSnSi layer in a common MOSFET device usually ranges from 10% to 15% by atom percent, and by adding the element Si, the strained GeSnSi layer with a Sn content of 10%-15% is basically stable at a temperature below 450° C., the heating temperature and the annealing temperature should not exceed 450° C.

A specific embodiment will be illustrated below with reference to FIG. 12 for a better understanding of the present disclosure.

Firstly, a Si substrate having a GeSi surface layer is provided and rinsed sequentially by acetone, absolute ethyl alcohol, deionized water and hydrofluoric acid.

Secondly, atoms and ions containing an element Sn are implanted into the GeSi surface layer by the magnetron sputtering. During the magnetron sputtering, a vacuum degree is less than $10^{-4}$ Pa, and the Si substrate is heated at a temperature ranging from 100° C. to 200° C. Firstly, a strained GeSnSi layer is formed on the GeSi surface layer, and then a Sn coating layer is formed on the strained GeSnSi layer. The strained GeSnSi layer may be annealed at a temperature ranging from 100° C. to 200° C. after the implanting so as to further improve the crystal quality of the strained GeSnSi layer.

Thirdly, the Sn coating layer is removed to expose the strained GeSnSi layer by means of a diluted hydrochloric acid (such as with a concentration of 10%).

Finally, the strained GeSnSi layer is re-annealed. Because there is no Sn coating layer on the strained GeSnSi layer, an annealing temperature may be up to 450° C. so as to further improve the crystal quality of the strained GeSnSi layer.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for forming a germanium-based layer, comprising:
    providing a substrate having a Ge or GeSi surface layer; and
    implanting atoms, molecules, ions or plasmas containing an element Sn into the Ge surface layer to form a Ge-based GeSn layer, or
    implanting atoms, molecules, ions or plasmas containing an element Sn into the GeSi surface layer to form a Ge-based GeSnSi layer, or
    co-implanting atoms, molecules, ions or plasmas containing elements Sn and Si into the Ge surface layer to form a Ge-based GeSnSi layer,
    wherein the Ge-based GeSn layer or the Ge-based GeSnSi layer is strained.

2. The method according to claim 1, further comprising:
    forming a mask on the substrate and forming an opening in the mask before the implanting, wherein the Ge or GeSi surface layer is exposed from the opening.

3. The method according to claim 1, wherein the implanting or the co-implanting comprises an ion implantation.

4. The method according to claim 3, wherein the ion implantation comprises a plasma source ion implantation and a plasma immersion ion implantation.

5. The method according to claim 1, wherein the implanting or the co-implanting comprises a magnetron sputtering.

6. The method according to claim 5, wherein during the magnetron sputtering, a negative bias voltage is applied to the substrate.

7. The method according to claim 5, wherein
    a Sn coating film is formed on the Ge-based GeSn layer or the Ge-based GeSnSi layer during the magnetron sputtering, if the atoms, molecules, ions or plasmas containing only the element Sn are implanted; or
    a Si—Sn coating film is formed on the Ge-based GeSnSi layer during the magnetron sputtering, if the atoms, molecules, ions or plasmas containing the elements Sn and Si are co-implanted.

8. The method according to claim 7, further comprising removing the Sn coating film or the Si—Sn coating film.

9. The method according to claim 8, wherein the Sn coating film or the Si—Sn coating film is removed by means of a rinse solution with a high selective etching ratio between the Ge-based GeSn layer and the Sn coating film or between the Ge-based GeSnSi layer and the Sn coating film or between the Ge-based GeSnSi layer and the Si—Sn coating film.

10. The method according to claim 1, further comprising heating the substrate at a heating temperature ranging from 100° C. to 600° C. during the implanting.

11. The method according to claim 10, wherein the heating temperature ranges from 150° C. to 450° C.

12. The method according to claim 1, further comprising annealing the Ge-based GeSn layer or the Ge-based GeSnSi layer at an annealing temperature ranging from 100° C. to 600° C. after the implanting.

13. The method according to claim 12, wherein the annealing temperature ranges from 150° C. to 450° C.

14. The method according to claim 1, wherein a thickness of the Ge-based GeSn layer or the Ge-based GeSnSi layer ranges from 0.5 nm to 100 nm.

15. The method according to claim 1, wherein a Sn content of the Ge-based GeSn layer or the Ge-based GeSnSi layer is less than 20% by atom percent.

16. The method according to claim 1, wherein the substrate having the Ge surface layer comprises any one of a Ge substrate, a Ge-on-insulator substrate and a Si substrate with a Ge surface.

17. The method according to claim 1, wherein the substrate having the GeSi surface layer comprises any one of a GeSi-on-insulator substrate, a Si substrate with a GeSi surface and a Ge substrate with a GeSi surface.

* * * * *